United States Patent [19]

Harrold et al.

[11] 4,156,846

[45] May 29, 1979

[54] DETECTION OF ARCING FAULTS IN GENERATOR WINDINGS

[75] Inventors: Ronald T. Harrold; Emil M. Fort, both of Murrysville; Herbert E. Pietsch, Monroeville, all of Pa.

[73] Assignee: Westinghouse Electric Corp., Pittsburgh, Pa.

[21] Appl. No.: 758,213

[22] Filed: Jan. 10, 1977

[51] Int. Cl.² ............................ G01R 31/06; G01R 31/02
[52] U.S. Cl. ........................ 324/158 MG; 324/51; 324/102; 361/31
[58] Field of Search ............ 324/158 MG, 102, 54, 324/51, 107; 361/31, 42; 322/99

[56] References Cited

U.S. PATENT DOCUMENTS 2,640,100  5/1953  Packer et al. ............... 324/158 MG

FOREIGN PATENT DOCUMENTS 604469   1934   Fed. Rep. of Germany ............ 361/31
47457  9/1927  Norway .................................... 324/51
155905  9/1932  Switzerland ............................ 324/51
591766   1947   United Kingdom ..................... 361/31

OTHER PUBLICATIONS

Roumainis, S. J.; "The Null Point..."; AIEE Transactions; Apr. 1956; pp. 147–152.

Primary Examiner—Rudolph V. Rolinec
Assistant Examiner—Ernest F. Karlsen
Attorney, Agent, or Firm—G. H. Telfer

[57] ABSTRACT

A method is provided for detecting the presence of arcing faults in the stator windings of large dynamoelectric machines, such as turbine generators. Arcing faults, such as broken strands in a winding conductor with continued arcing, give rise to high frequency currents which flow in the neutral lead of the generator winding. The presence of the arcing fault can thus be detected by observing the high frequency neutral currents and monitoring them for the presence of the characteristic frequency distribution resulting from the resonance characteristics of the current path.

2 Claims, 4 Drawing Figures

DETECTION OF ARCING FAULTS IN GENERATOR WINDINGS

BACKGROUND OF THE INVENTION

The present invention relates to the detection of arcing faults in the stator windings of large dynamoelectric machines, such as turbine generators.

Large turbine generators are highly reliable machines but they are nevertheless subject to the possibility of occurrence of various types of faults. It is, of course, highly desirable to detect such faults, or other abnormal conditions, at an early or incipient stage so that remedial action can be taken before a complete failure occurs. One such type of fault is an arcing fault between strands, or between adjacent ends of a broken strand, in the high-voltage stator winding conductors of a generator. The stator windings of a large generator are made up of stranded conductors enclosed in relatively heavy high-voltage insulation and suitably connected together, and faults may occur due to breaking of one or more strands in the conductors themselves or the connections, or to local insulation failures between adjacent strands. Such faults cause intermittent or repeated arcing between the strands, or the strand ends involved, and lead to increasing overheating and eventual breakdown of the major ground insulation, with resulting serious or catastrophic electrical failure. Such a failure can cause serious damage to the machine because of the excessive temperatures and arcing or flashovers within the machine, so that such a fault usually requires extensive repairs with an extended shutdown of the machine and heavy expense. Obviously, it would be desirable to detect the occurrence of such a fault in an early or incipient stage, before any serious damage has occurred, so that remedial action can be taken. Heretofore, it has been attempted to detect such conditions as early as possible during the overheating stage by means of temperature detectors of various kinds or, more recently, by detecting the emission of particulate matter from the insulation itself. Such fault detection methods, however, are dependent on the occurrence of abnormal temperatures and, therefore, do not detect the fault at as early a stage as would be desirable.

SUMMARY OF THE INVENTION

The present invention provides a method for detecting the occurrence of such arcing faults as soon as arcing commences and before overheating has occurred or has progressed to the point where it could reliably be detected. The arcing involved in this type of fault is not continuous, but is more or less regularly interrupted and reignited because it is an alternating current arc and also because of relative movement between the strands or broken ends involved. The result is the repeated production of short-duration current pulses in the winding which appear as a high frequency current to ground. These high frequency currents due to arcing can be detected in the neutral lead of the generator. The equivalent current path for these high frequency neutral currents is essentially a series circuit comprising inductance and capacitance and has a relatively high series resonant frequency. The result is that the neutral currents due to arcing have a characteristic frequency distribution which can be predicted from the resonant characteristics of the current path and which is distinctively different from the frequency distribution of neutral currents resulting from other causes such as corona discharges within insulation voids, for example. The existence of arcing faults, therefore, can be detected at a very early stage by observing the high frequency currents in the neutral load of the generator, and monitoring them for the occurrence of the characteristic spectral distribution indicating the existence of such a fault. In this way, the fault can be detected before substantial overheating can occur and its presence can be discovered at a very early stage so that remedial action can be taken before serious damage occurs.

BRIEF DESCRIPTION OF THE DRAWINGS

The invention will be more fully understood from the following detailed description, taken in connection with the accompanying drawings, in which.

DESCRIPTION OF THE PREFERRED EMBODIMENT

Figure 1:
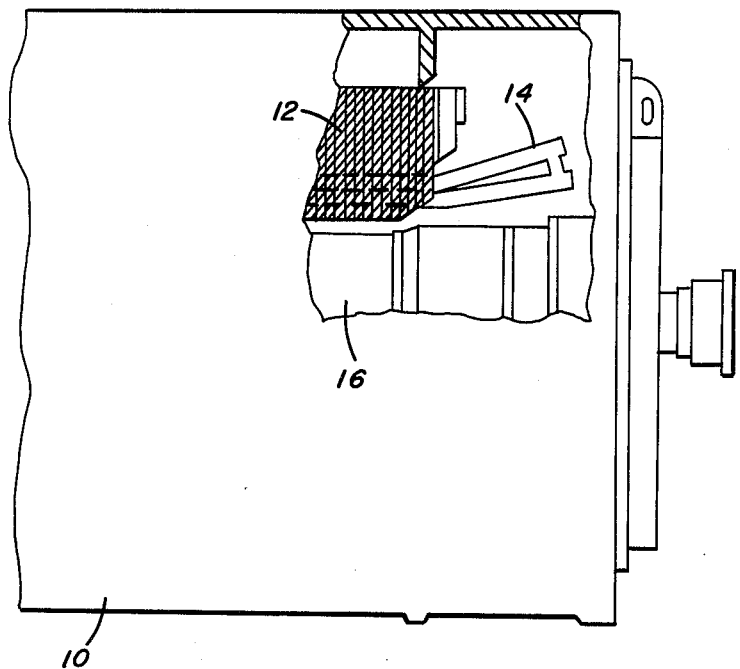
FIG. 1 is a view of a large generator of the type which may be subject to arcing faults.

As previously indicated, the present invention is particularly intended for the detection of arcing faults in large, high-voltage turbine generators. A typical generator construction is shown by way of illustration in FIG. 1. The machine there shown has an outer gas-tight housing 10 completely enclosing the machine and usually containing hydrogen which is circulated through the machine as a coolant gas. The generator has a laminated stator core 12 which carries the armature or stator winding 14 disposed in slots in the core, and a cylindrical rotor 16 carrying the field winding is supported in bearings in the ends of the housing.

Figure 2:
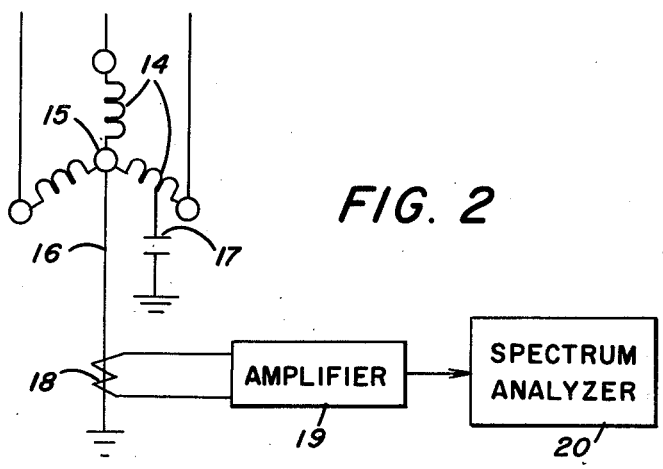
FIG. 2 is a schematic diagram of the stator windings of such a machine showing the manner in which the invention is applied.

The stator winding 14 normally consists of stranded copper conductors placed in longitudinal slots in the core 12 and suitably connected together to form a polyphase winding. Each conductor is made up of a relatively large number of individually insulated copper strands which are usually arranged in two or more transposed stacks enclosed in relatively thick high-voltage insulation usually consisting of mica or glass tape impregnated with suitable organic resins. Such conductors are subject to vibration during operation, and may be occasionally subjected to very high mechanical forces under short-circuit conditions on the system to which the machine is connected. These and other forces may occasionally cause internal faults within the conductor itself, these faults consisting of local insulation failures between adjacent strands or breakage of one or more strands. Such faults result in arcing between the adjacent strands or between the ends of the broken strands. The arcing, however, is not continuous but is more or less regularly interrupted and reignited, because it is an alternating current arc, and also because of relative movement particularly in the case of broken strands, where vibration may cause continuing relative movement between the broken ends. This repetitive or intermittent arcing results in the production of repeated short-duration current pulses, giving rise to high frequency currents in the conductor. As indicated above, and as shown in FIG. 2, the generator stator windings 14 are usually connected in a three-phase circuit with a neutral point 15 and with a neutral conductor or lead 16 which is externally connected to ground. A current path thus exists from the arcing fault, which may occur anywhere in the windings 14, through the neutral lead 16 to ground, the path being completed through the capacitance 17 between the winding conductors and the grounded core of the machine.

The stator windings of large high-voltage generators are of relatively large physical size and because of their size and the arrangement of the machine, the windings have relatively high capacitance to ground which may be of the order of 10,000 picofarads. For the same reasons, these windings have low series inductance which may be in the range of 40 microhenries. The resonant frequency for this series circuit can be calculated and is typically of the order of 250 kilohertz for large turbine generators of usual construction.

The high frequency signals generated in the manner indicated above by an arcing fault may be relatively large. For example, one strand in a typical machine may carry a current of 1000 amperes at full load and, with the typical constants indicated above and a time constant of approximately 100 mircoseconds, the self-induced voltage at the faulted strand would be in the neighborhood of 40 volts. The high frequency currents in the neutral lead 16, therefore, are of easily detectable magnitude. These currents have a characteristic frequency distribution due to the resonant characteristics of the current path, as discussed above, and the ocurrence of this frequency distribution is a reliable indication of the presence of an arcing fault in the generator winding.

This characteristic frequency distribution can readily be distinguished from the spectral characteristics, or frequency distribution, of other high frequency currents which may occur in the neutral lead due to other reasons. For example, corona discharges may occur in the slots of the machine if the conductive coating on the surface of the conductor insulation loses contact with the core. This is a relatively rare occurrence with the coatings used in modern machines but it can occur. It is also possible for discharges to occur in voids in the insulation. Such discharges, however, are coupled to the winding by a very small capacitance so that the spectral characteristics of the neutral currents resulting from such discharges would be entirely different from those of the currents due to arcing faults, since they would flow through current paths having quite different resonant frequencies. Such currents, therefore, can easily be distinguished from those due to arcing faults in the conductor itself.

Figure 3:
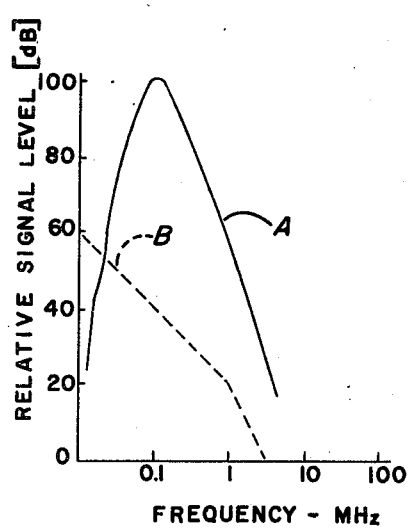
FIG. 3 is a set of curves showing calculated frequency distributions for different types of abnormal conditions in the generator.
Figure 4:
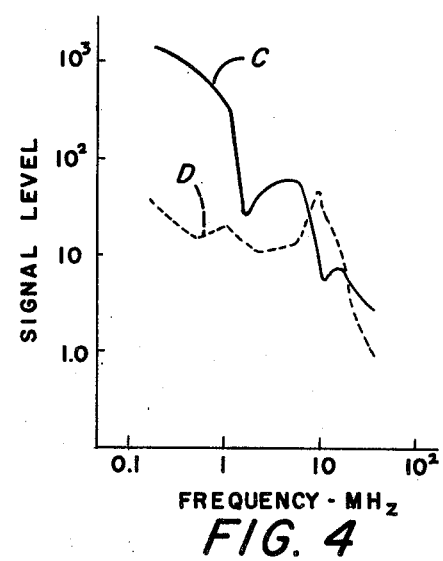
FIG. 4 is a similar set of curves showing test results.

The effectiveness of this method of detecting arcing faults is illustrated in the curves of FIGS. 3 and 4. FIG. 3 shows calculated curves based on the constants of a large generator of typical construction. The curve A represents the calculated frequency distribution due to arcing resulting from a broken strand, the curve showing relative signal levels in decibels plotted against frequency. It will be seen that the resonant frequency occurs at approximately 0.2 MHz, thus agreeing with the value indicated above, and falls steeply in a typical resonance curve as the frequency increases. Curve B shows the calculated frequency distribution of currents resulting from internal corona discharges in voids in the insulation. It will be seen that this curve is very different from curve A, and peaks at a much lower frequency, so that the two curves are readily distinguishable.

FIG. 4 shows similar curves obtained in simulated tests on an actual large turbine generator. Curve C shows the frequency distribution of neutral currents due to broken strands in the stator winding, while curve D shows the frequency distribution of the neutral currents occuring as a result of simulated corona discharges in the winding insulation. It will be noted that curve C has a resonance peak substantially at the same frequency as the calculated curve A of FIG. 3, with a lower peak at a considerably higher frequency. The corona curve D is also generally similar to the calculated curve B in the same frequency range, and is quite different from curve C so that it is readily distinguishable. In particular, the corona curve D is relatively flat over a substantial frequency range while the broken strand curve C has a magnitude at 0.15 MHz more than 200 times as great as its magnitude at 15 MHz. Thus, the two curves are readily distinguishable and the occurrence of high frequency currents having the characteristic spectral distribution of curve C is a reliable indication of the presence of an arcing fault in the generator winding.

The high frequency current signals in the neutral lead 16 can be detected and monitored in any desired manner. Thus, as shown in FIG. 2, a current transformer 18 may be utilized with its output connected to an amplifier 19. The amplifier 19 should preferably be a non-linear amplifier in order to respond to signals over an amplitude range covering several decades. Any suitable type of amplifier may be used, however. The output of the amplifier 19 is supplied to a suitable indicating or recording instrument to monitor the high frequency currents in the neutral lead. As shown in FIG. 2, a spectrum analyzer 20 is preferably utilized which will continuously indicate the spectral distribution of the high frequency currents in the neutral lead 16. The spectrum analyzer 20 may either provide a continuous chart type of readout, or may show the frequency distribution curve in any suitable type of visual display. In either case, the resulting curve can be compared with a known or calculated frequency spectrum, such as that of curve C, and an audible or visual alarm, or other desired response, can be initiated either automatically or manually.

The spectral distribution characteristic of arcing faults is readily distinguished from the spectral distribution of high frequency currents due to other causes, as discussed above, and a reliable fault detection system is thus provided. In many cases, the continuous monitoring of the high frequency currents can be substantially simplified because of the characteristic shape of the frequency curve. That is, instead of obtaining a complete frequency spectrum, the spectrum analyzer may be utilized in a simpler manner, or replaced by a simpler device, to continuously observe the ratio of the magnitude of the spectral components at a frequency such as 0.15 MHz to the magnitude of the spectral components at a substantially higher frequency such as 15 MHz. The spectral distribution characteristic of an arcing fault will result in a ratio of the order of about 200, whereas in the case of corona discharges such as those shown by curve D of FIG. 4, this ratio would be very low. Thus, a reliable and accurate indication can be obtained in this simple and relatively inexpensive manner. In general, any suitable detection or recording means such as spectrum analyzers of any type, radio noise meters, or similar devices may be used to respond to the characteristic spectral distribution and provide whatever type of signal, alarm or other response is desired.

It should now be apparent that a fault detection method has been provided which makes it possible to reliably and accurately detect the existence of arcing faults in the stator windings of large generators at a very early or incipient stage in the development of such faults and before any substantial overheating occurs. This makes it possible to detect such faults at an early enough stage to deal with them before any serious damage has occurred and thus to prevent the occurence of a serious fault with correspondingly extensive damage.

What is claimed is:

1. A method of detecting arcing faults in the stator windings of a dynamoelectric machine having a polyphase winding with a grounded neutral lead, said method comprising:

monitoring current in the neutral lead during operation of the machine;

developing, from the monitored neutral lead current, a representation of the frequency distribution of components of the current;

detecting when the developed representation contains a component have a peak at a high frequency substantially corresponding to the series resonant frequency of the inductive and capacitive current path to ground of arcing fault currents due to the breaking of one or more strands of the winding conductors, so as to distinguish from high frequency current components due to corona in the winding insulation which lack such a peak; said detecting including comparison of the magnitude of the current at the resonant frequency with that at a frequency orders of magnitude higher to find a difference in current magnitude of at least as many orders of magnitude as the difference in the two frequencies.

2. A method in accordance with claim 1, wherein: the resonant frequency is about 0.15 megahertz and the higher frequency is about 15 megahertz.

* * * * *